United States Patent
Sakai et al.

(10) Patent No.: US 12,057,307 B2
(45) Date of Patent: Aug. 6, 2024

(54) GROUP-III ELEMENT NITRIDE SEMICONDUCTOR SUBSTRATE

(71) Applicant: NGK INSULATORS, LTD., Nagoya (JP)

(72) Inventors: Masahiro Sakai, Nagoya (JP); Shohei Oue, Nagoya (JP)

(73) Assignee: NGK INSULATORS, LTD., Nagoya (JP)

(*) Notice: Subject to any disclaimer, the term of this patent is extended or adjusted under 35 U.S.C. 154(b) by 0 days.

(21) Appl. No.: 18/180,272

(22) Filed: Mar. 8, 2023

(65) Prior Publication Data

US 2023/0220587 A1 Jul. 13, 2023

Related U.S. Application Data

(63) Continuation of application No. PCT/JP2021/020278, filed on May 27, 2021.

(30) Foreign Application Priority Data

Oct. 14, 2020 (JP) .................................. 2020-173012

(51) Int. Cl.
*B32B 3/00* (2006.01)
*C30B 29/40* (2006.01)
(Continued)

(52) U.S. Cl.
CPC ...... *H01L 21/02005* (2013.01); *C30B 29/406* (2013.01); *C30B 19/04* (2013.01); *H01L 21/02458* (2013.01); *H01L 21/0254* (2013.01)

(58) Field of Classification Search
CPC .................................................... C30B 29/406
See application file for complete search history.

(56) References Cited

U.S. PATENT DOCUMENTS 6,488,767 B1 12/2002 Xu et al.
6,875,082 B2 4/2005 Nakayama et al.
(Continued)

FOREIGN PATENT DOCUMENTS

JP 4350505 B2 9/2004
JP 3581145 B1 10/2004
(Continued)

OTHER PUBLICATIONS

JP-2004087678-A (Year: 2004).*
(Continued)

*Primary Examiner* — Elizabeth E Mulvaney
(74) *Attorney, Agent, or Firm* — FLYNN THIEL, P.C.

(57) ABSTRACT

There is provided a Group-III element nitride semiconductor substrate including a first surface and a second surface, in which even when devices to be produced on the first surface are increased in size, variations in device characteristics between the devices in the same substrate are suppressed. A Group-III element nitride semiconductor substrate includes a first surface and a second surface. The Group-III element nitride semiconductor substrate satisfies at least one of the following items (1) to (3): (1) The main surface has a maximum height Wz of a surface waviness profile of 150 nm or less; (2) The main surface has a root mean square height Wq of the surface waviness profile of 25 nm or less; (3) The main surface has an average length WSm of surface waviness profile elements of 0.5 mm or more.

12 Claims, 2 Drawing Sheets

(51) Int. Cl.
 *H01L 21/02* (2006.01)
 *C30B 19/04* (2006.01)

(56) References Cited

U.S. PATENT DOCUMENTS

| | | |
|---|---|---|
| 7,045,808 B2 | 5/2006 | Shibata |
| 9,196,480 B2 | 11/2015 | Kuraoka et al. |
| 2018/0297168 A1 | 10/2018 | Tanaka et al. |

FOREIGN PATENT DOCUMENTS

| | | |
|---|---|---|
| JP | 2005-263609 A | 9/2005 |
| JP | 4380791 B2 | 5/2009 |
| JP | 5244628 B2 | 8/2010 |
| JP | 2011-236078 A | 11/2011 |
| JP | 201779249 A | 4/2017 |
| WO | 2014/156914 A1 | 10/2014 |

OTHER PUBLICATIONS

International Search Report, with English translation, issued in corresponding International Application No. PCT/JP2021/020278, date of mailing Aug. 3, 2021 (5 pages).
Written Opinion of International Searching Authority issued in corresponding International Application No. PCT/JP2021/020278, date of mailing Aug. 3, 2021 (4 pages).
English Translation of the International Preliminary Report on Patentability, issued in corresponding International Application No. PCT/JP2021/020278, Date of Mailing Apr. 27, 2023 (6 pages).
Notice of Reasons for Refusal with English translation issued in corresponding Japanese Application No. 2022-556389 dated Apr. 23, 2024 (7 pages).

* cited by examiner

GROUP-III ELEMENT NITRIDE SEMICONDUCTOR SUBSTRATE

CROSS-REFERENCE TO RELATED APPLICATIONS

This application is a continuation under 35 U.S.C. 120 of International Application PCT/JP2021/020278 having the International Filing Date of 27 May 2021 and having the benefit of the earlier filing date of Japanese Application No. 2020-173012, filed on 14 Oct. 2020. Each of the identified applications is fully incorporated herein by reference.

BACKGROUND OF THE INVENTION

1. Field of the Invention

The present invention relates to a Group-III element nitride semiconductor substrate. More specifically, the present invention relates to a Group-III element nitride semiconductor substrate including a first surface and a second surface, in which variations in quality in the first surface are suppressed.

2. Description of the Related Art

Group-III element nitride semiconductor substrates, such as a gallium nitride (GaN) wafer, an aluminum nitride (AlN) wafer, and an indium nitride (InN) wafer, have been used as the substrates of various semiconductor devices (e.g., Patent Literature 1).

A semiconductor substrate includes a first surface and a second surface. When the first surface is defined as a main surface, and the second surface is defined as a back surface, the main surface is typically a Group-III element polar surface, and the back surface is typically a nitrogen polar surface. An epitaxial crystal may be grown on the main surface, and various devices may be produced thereon.

There have been reported technologies involving reducing the surface roughness of the Group-III element nitride semiconductor substrate, to thereby achieve satisfactory crystallinity of a growth film of the epitaxial crystal to be formed on the main surface, achieve satisfactory performance of the device to be formed on the main surface, and reduce variations in performance of the device to be formed on the main surface (Patent Literatures 2 to 4).

In Patent Literature 2, there has been reported a nitride semiconductor substrate, having: a diameter of 45 mm or more; a single-mode distortion which has a maximum or a minimum of a central height H of 12 µm or less or of a distortion curvature radius of 21 m or more; a top surface of roughness satisfying 0.1 nm≤RMS≤5 nm and a bottom surface of roughness satisfying 0.1 nm≤RMS≤5,000 nm by CMP; and a total thickness variation (TTV) measured at sampling points defined at an interval of 0.1 mm of 10 µm or less. In Patent Literature 2, there has been reported that satisfactory morphology can be achieved after epitaxial growth when RMS measured in a 10 µm square with an AFM is set to 0.1 nm≤RMS≤5 nm (paragraph 0059), and TTV measured at an interval of 0.1 mm is set to 10 µm or less (paragraph 0061).

In Patent Literature 3, there has been reported a method of processing a wafer blank including $Al_xGa_yIn_zN$, in which an $Al_xGa_yIn_zN$ wafer to be processed has a surface roughness characterized by a root mean square (RMS) surface roughness of less than 1 nm in a 10×10 µm² area at its Ga-side. In Patent Literature 3, there has been reported that it is important to set the RMS surface roughness (measurement range: 10×10 µm²) to less than 1 nm for achieving satisfactory quality of an AlGaInN crystal subsequently grown on a substrate.

In Patent Literature 4, there has been reported a GaN crystal substrate, in which a warping W(R) of a back surface of the GaN substrate satisfies −35 µm≤W(R)≤45 µm, and a surface roughness Ra of a front surface thereof satisfies Ra≤5 nm (the sign of the warping here is "+" and "−" when a crystal growth surface has a convex shape and a concave shape, respectively). In Patent Literature 4, there has been reported that a semiconductor layer having satisfactory crystallinity can be grown by setting the surface roughness Ra to 5 nm or less (measured in a range of 80×110 µm² with a 3D-SEM and in a range of 700×750 µm² with a laser displacement sensor) (paragraph 0068).

As described above, attempts have hitherto been made to reduce the surface roughness of the surface of the substrate in a microscopic region at such a level as 10×10 µm², 80×110 µm², or 700×750 µm², to thereby achieve satisfactory crystallinity of a growth film of the epitaxial crystal to be formed on the main surface of the Group-III element nitride semiconductor substrate, achieve satisfactory performance of the device to be formed on the main surface, and reduce variations in performance of the device to be formed on the main surface.

Incidentally, the Group-III element nitride semiconductor substrate has been used as a base substrate of a light-emitting device, such as an LED or an LD. In recent years, its application to a high-frequency/high-power electronic device has also received attention. In particular, a device for handling large electric power entails an increase in element size, and hence the Group-III element nitride semiconductor substrate is required to be increased in diameter from 2 inches (diameter: 50.8 mm), which is the current mainstream, to 4 inches (about 100 mm), 6 inches (about 150 mm), or the like.

However, there is a marked problem in that, as devices to be produced on the main surface of the Group-III element nitride semiconductor substrate are more increased in size, device characteristics are degraded more, and variations in device characteristics between the devices in the same substrate are increased more.

CITATION LIST

Patent Literature

[PTL 1] JP 2005-263609 A
[PTL 2] JP 3581145 B1
[PTL 3] JP 4350505 B2
[PTL 4] JP 4380791 B2

SUMMARY OF THE INVENTION

An object of the present invention is to provide a Group-III element nitride semiconductor substrate including a first surface and a second surface, in which even when devices to be produced on the first surface are increased in size, variations in device characteristics between the devices in the same substrate are suppressed.

A Group-III element nitride semiconductor substrate according to one embodiment of the present invention includes: a first surface; and a second surface, wherein the first surface has a maximum height Wz of a surface waviness profile of 150 nm or less.

A Group-III element nitride semiconductor substrate according to another embodiment of the present invention includes: a first surface; and a second surface, wherein the first surface has a root mean square height Wq of a surface waviness profile of 25 nm or less.

A Group-III element nitride semiconductor substrate according to still another embodiment of the present invention includes: a first surface; and a second surface, wherein the first surface has an average length WSm of surface waviness profile elements of 0.5 nm or more.

In one embodiment, the first surface of the Group-III element nitride semiconductor substrate has a root mean square roughness Rms of 10 nm or less.

In one embodiment, the Group-III element nitride semiconductor substrate has a diameter of 75 mm or more.

DESCRIPTION OF THE EMBODIMENTS

When the expression "weight" is used herein, the expression may be replaced with "mass" that is commonly used as an SI unit representing a weight.

A Group-III element nitride semiconductor substrate according to an embodiment of the present invention is typically a freestanding substrate formed of a Group-III element nitride crystal. In the description of the present invention, the term "freestanding substrate" means a substrate that is not deformed or broken by its own weight at the time of its handling, and hence can be handled as a solid. The freestanding substrate may be used as each of the substrates of various semiconductor devices, such as a light-emitting device and a power-controlling device.

The Group-III element nitride semiconductor substrate according to the embodiment of the present invention is typically a wafer shape (substantially complete round shape). However, the substrate may be processed into any other shape such as a rectangular shape as required.

Any appropriate diameter may be adopted as the diameter of the Group-III element nitride semiconductor substrate according to the embodiment of the present invention to the extent that the effects of the present invention are not impaired. The diameter of the Group-III element nitride semiconductor substrate according to the embodiment of the present invention is preferably 50 mm or more, more preferably 75 mm or more, still more preferably 100 mm or more because the effects of the present invention can be expressed to a larger extent. Particularly when the Group-III element nitride semiconductor substrate according to the embodiment of the present invention is a so-called large-diameter Group-III element nitride semiconductor substrate having a diameter of 75 mm or more, the Group-III element nitride semiconductor substrate according to the embodiment of the present invention is easily applied to a high-frequency/high-power electronic device, particularly to such a device for handling large electric power as to entail an increase in element size.

Specific examples of the large-diameter Group-III element nitride semiconductor substrate include a 4-inch wafer, a 6-inch wafer, an 8-inch wafer, and a 12-inch wafer.

The thickness of the Group-III element nitride semiconductor substrate according to the embodiment of the present invention (when the thickness is not constant, the thickness of a site having the largest thickness) is preferably from 300 μm to 1,000 μm.

Typical examples of the Group-III element nitride include gallium nitride (GaN), aluminum nitride (AlN), indium nitride (InN), and a mixed crystal thereof. Those nitrides may be used alone or in combination thereof.

The Group-III element nitride is specifically GaN, AlN, InN, $Ga_xAl_{1-x}N$ (1>x>0), $Ga_xIn_{1-x}N$ (1>x>0), $Al_xIn_{1-x}N$ (1>x>0), or $Ga_xAl_yIn_zN$ (1>x>0, 1>y>0, x+y+z=1). Those nitrides may be doped with various n-type dopants or p-type dopants.

Typical examples of the p-type dopant include beryllium (Be), magnesium (Mg), strontium (Sr), and cadmium (Cd). Those dopants may be used alone or in combination thereof.

Typical examples of the n-type dopant include silicon (Si), germanium (Ge), tin (Sn), and oxygen (O). Those dopants may be used alone or in combination thereof.

The plane direction of the Group-III element nitride semiconductor substrate may be set to any one of a c-plane, an m-plane, an a-plane, and a specific crystal plane tilted from each of the c-plane, the a-plane, and the m-plane, and particularly when the plane direction is set to the c-plane, the effects of the present invention are expressed to a larger extent. Examples of the specific crystal plane tilted from each of the c-plane, the a-plane, and the m-plane may include so-called semipolar planes, such as a {11-22} plane and a {20-21} plane. In addition, the plane direction is permitted to include not only a so-called just plane vertical to the c-plane, the a-plane, the m-plane, or the specific crystal plane tilted from each of the planes but also an off angle in the range of ±5°.

The Group-III element nitride semiconductor substrate according to the embodiment of the present invention is a Group-III element nitride semiconductor substrate including a first surface and a second surface. When the first surface is defined as a main surface, and the second surface is defined as a back surface, as long as the plane direction of the Group-III element nitride semiconductor substrate is the c-plane, the main surface is typically a Group-III element polar surface, and the back surface is typically a nitrogen polar surface. However, the main surface may be set to the nitrogen polar surface, and the back surface may be set to the Group-III element polar surface. An epitaxial crystal may be grown on the main surface, and various devices may be produced thereon. The back surface may be held with a susceptor or the like to transfer the Group-III element nitride semiconductor substrate according to the embodiment of the present invention.

In the description of the Group-III element nitride semiconductor substrate according to the embodiment of the present invention, the first surface is described as the main surface, and the second surface is described as the back surface. Accordingly, in this description, the term "main surface" may be replaced with "first surface," the term "first surface" may be replaced with "main surface," the term "back surface" may be replaced with "second surface," and the term "second surface" may be replaced with "back surface."

The main surface may be a mirror surface or a non-mirror surface. The main surface is preferably a mirror surface.

The main surface is preferably a surface from which an affected layer is substantially removed and which has a small surface roughness in a microscopic region from the viewpoint of obtaining a semiconductor substrate in which devices to be produced by epitaxially growing device layers have satisfactory characteristics and variations in device characteristics between the devices are reduced.

The back surface may be a mirror surface or a non-mirror surface.

The term "mirror surface" refers to a surface subjected to mirror processing, the surface being brought into a state in which the roughness and waviness of the surface are reduced to such an extent that light is reflected after the mirror processing, and hence the fact that an object is reflected on the surface subjected to the mirror processing can be visually observed. In other words, the term refers to a surface in a state in which the magnitude of each of the roughness and waviness of the surface after the mirror processing is reduced to such an extent as to be sufficiently negligible with respect to the wavelength of visible light.

Any appropriate method may be adopted as a method for the mirror processing to the extent that the effects of the present invention are not impaired. An example of such method is a method including performing the mirror processing through use of one, or a combination of two or more, of the following apparatus: a polishing apparatus using a tape; a lapping apparatus using diamond abrasive grains; and a chemical mechanical polish (CMP) apparatus using a slurry such as colloidal silica and a polishing pad made of a nonwoven fabric. When the affected layer remains on the surface after the processing, the affected layer is removed. As a method of removing the affected layer, there are given, for example, a method including removing the affected layer through use of reactive ion etching (RIE) or a chemical liquid, and a method including annealing the substrate.

The term "non-mirror surface" refers to a surface that is not subjected to mirror processing, and a typical example thereof is a rough surface obtained by surface-roughening treatment.

Any appropriate method may be adopted as a method for the surface-roughening treatment to the extent that the effects of the present invention are not impaired. Examples of such method include: grinding with abrasive grains; laser texture processing; etching treatment with various chemical liquids and gases; physical or chemical coating treatment; and texturing by machining.

When a residual stress resulting from the affected layer is recognized on the surface after back surface processing, the residual stress is preferably eliminated by removing the affected layer. As a method of removing the affected layer, there are given, for example, a method including removing the affected layer through use of reactive ion etching (RIE) or a chemical liquid, and a method including annealing the substrate.

Figure 1:
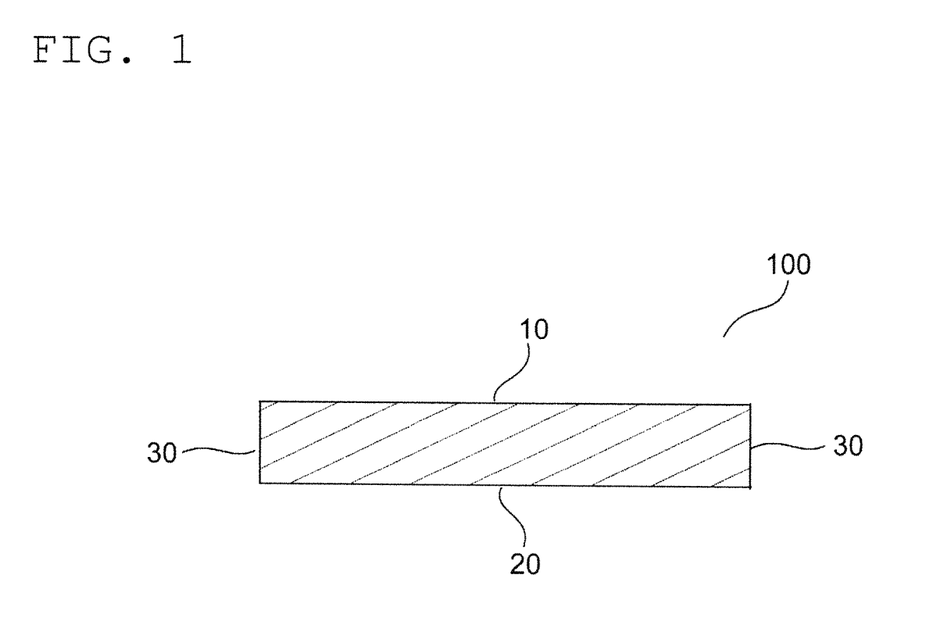
FIG. 1 is a typical schematic sectional view of a Group-III element nitride semiconductor substrate according to an embodiment of the present invention.

FIG. 1 is a typical schematic sectional view of the Group-III element nitride semiconductor substrate according to the embodiment of the present invention. As illustrated in FIG. 1, a Group-III element nitride semiconductor substrate 100 according to the embodiment of the present invention typically has a main surface (Group-III element polar surface) 10 and a back surface (nitrogen polar surface) 20. The Group-III element nitride semiconductor substrate 100 according to the embodiment of the present invention may have a side surface 30.

An end portion of the Group-III element nitride semiconductor substrate according to the embodiment of the present invention may adopt any appropriate form to the extent that the effects of the present invention are not impaired. Examples of the shape of the end portion of the Group-III element nitride semiconductor substrate according to the embodiment of the present invention include: a shape in which chamfered portions on a main surface side and on a back surface side are each chamfered so as to be a flat surface; a shape in which the chamfered portions on the main surface side and on the back surface side are each chamfered in an R-shape; a shape in which only the chamfered portion on the main surface side of the end portion is chamfered so as to be a flat surface; and a shape in which only the chamfered portion on the back surface side of the end portion is chamfered so as to be a flat surface.

When the end portion of the Group-III element nitride semiconductor substrate according to the embodiment of the present invention is chamfered, the chamfered portion may be arranged over the one entire round of an outer peripheral portion, or may be arranged only in part of the outer peripheral portion.

The Group-III element nitride semiconductor substrate according to the embodiment of the present invention typically satisfies at least one selected from the group consisting of the following items (1) to (3).
(1) The main surface has a maximum height $Wz$ of a surface waviness profile of 150 nm or less.
(2) The main surface has a root mean square height $Wq$ of the surface waviness profile of 25 nm or less.
(3) The main surface has an average length $WSm$ of surface waviness profile elements of 0.5 mm or more.

That is, the Group-III element nitride semiconductor substrate according to the embodiment of the present invention is typically selected from the group consisting of: a form of satisfying the above-mentioned item (1) and not satisfying the above-mentioned items (2) and (3); a form of satisfying the above-mentioned item (2) and not satisfying the above-mentioned items (1) and (3); a form of satisfying the above-mentioned item (3) and not satisfying the above-mentioned items (1) and (2); a form of satisfying the above-mentioned items (1) and (2) and not satisfying the above-mentioned item (3); a form of satisfying the above-mentioned items (1) and (3) and not satisfying the above-mentioned item (2); a form of satisfying the above-mentioned items (2) and (3) and not satisfying the above-mentioned item (1); and a form of satisfying all of the above-mentioned items (1), (2), and (3).

The number of items, out of the above-mentioned items (1) to (3), satisfied by the Group-III element nitride semiconductor substrate according to the embodiment of the present invention is preferably as large as possible.

When the Group-III element nitride semiconductor substrate according to the embodiment of the present invention satisfies at least one selected from the group consisting of the above-mentioned items (1) to (3), even in the case where devices to be produced on the main surface are increased in size, variations in device characteristics between the devices in the same substrate can be suppressed.

With regard to the above-mentioned item (1), in the Group-III element nitride semiconductor substrate according to the embodiment of the present invention, the maximum height $Wz$ of the surface waviness profile of the main surface is preferably 150 nm or less, more preferably 120 nm or less, still more preferably 80 nm or less, particularly preferably 50 nm or less. The lower limit value of the maximum height $Wz$ of the surface waviness profile of the main surface is desirably as small as possible. In the Group-III element nitride semiconductor substrate according to the embodiment of the present invention, when the maximum height Wz of the surface waviness profile of the main surface falls within the above-mentioned ranges, even in the case where devices to be produced on the main surface are increased in size, variations in device characteristics between the devices in the same substrate can be suppressed. In the Group-III element nitride semiconductor substrate according to the embodiment of the present invention, when the maximum height Wz of the surface waviness profile of the main surface deviates from the above-mentioned ranges and becomes too large, in the case where devices to be produced on the main surface are increased in size, variations in device characteristics between the devices in the same substrate may be increased.

With regard to the above-mentioned item (1), a method of measuring the maximum height Wz of the surface waviness profile of the main surface in the Group-III element nitride semiconductor substrate according to the embodiment of the present invention is described later.

With regard to the above-mentioned item (2), in the Group-III element nitride semiconductor substrate according to the embodiment of the present invention, the root mean square height Wq of the surface waviness profile of the main surface is preferably 25 nm or less, more preferably 20 nm or less, still more preferably 12 nm or less, particularly preferably 10 nm or less. The lower limit value of the root mean square height Wq of the surface waviness profile of the main surface is desirably as small as possible. In the Group-III element nitride semiconductor substrate according to the embodiment of the present invention, when the root mean square height Wq of the surface waviness profile of the main surface falls within the above-mentioned ranges, even in the case where devices to be produced on the main surface are increased in size, variations in device characteristics between the devices in the same substrate can be suppressed. In the Group-III element nitride semiconductor substrate according to the embodiment of the present invention, when the root mean square height Wq of the surface waviness profile of the main surface deviates from the above-mentioned ranges and becomes too large, in the case where devices to be produced on the main surface are increased in size, variations in device characteristics between the devices in the same substrate may be increased.

With regard to the above-mentioned item (2), a method of measuring the root mean square height Wq of the surface waviness profile of the main surface in the Group-III element nitride semiconductor substrate according to the embodiment of the present invention is described later.

With regard to the above-mentioned item (3), in the Group-III element nitride semiconductor substrate according to the embodiment of the present invention, the average length WSm of the surface waviness profile elements of the main surface is preferably 0.5 mm or more, more preferably 1.0 mm or more, still more preferably 1.5 mm or more, particularly preferably 3.0 mm or more. The upper limit value of the average length WSm of the surface waviness profile elements of the main surface is realistically 10 mm or less in consideration of a measurement limit. In the Group-III element nitride semiconductor substrate according to the embodiment of the present invention, when the average length WSm of the surface waviness profile elements of the main surface falls within the above-mentioned ranges, even in the case where devices to be produced on the main surface are increased in size, variations in device characteristics between the devices in the same substrate can be suppressed. In the Group-III element nitride semiconductor substrate according to the embodiment of the present invention, when the average length WSm of the surface waviness profile elements of the main surface deviates from the above-mentioned ranges and becomes too small, in the case where devices to be produced on the main surface are increased in size, variations in device characteristics between the devices in the same substrate may be increased.

With regard to the above-mentioned item (3), a method of measuring the average length WSm of the surface waviness profile elements of the main surface in the Group-III element nitride semiconductor substrate according to the embodiment of the present invention is described later.

With regard to the above-mentioned items (1) to (3), the measurement of the maximum height Wz of the surface waviness profile of the main surface, the measurement of the root mean square height Wq of the surface waviness profile of the main surface, and the measurement of the average length WSm of the surface waviness profile elements of the main surface are each preferably performed in a region excluding, from the entire region of the main surface, the chamfered portion of the outer peripheral portion in which no device is formed (non-device-formation region).

As described above, the main surface is preferably a surface from which an affected layer is substantially removed and which has a small surface roughness in a microscopic region from the viewpoint of obtaining a semiconductor substrate in which devices to be produced by epitaxially growing device layers have satisfactory characteristics and variations in device characteristics between the devices are reduced. From this viewpoint, the root mean square roughness Rms of the main surface measured in a 10 μm square with an AFM is preferably 10 nm or less, more preferably 3 nm or less, still more preferably 1 nm or less.

Any appropriate method may be adopted as a method of processing the main surface to the extent that the effects of the present invention are not impaired. An example of such method is a method including performing the mirror processing through use of one, or a combination of two or more, of the following apparatus: a grinding apparatus using diamond abrasive grains; a grinding apparatus using a tape; a lapping apparatus using diamond abrasive grains; and a chemical mechanical polish (CMP) apparatus using a slurry such as colloidal silica and a polishing pad made of a nonwoven fabric. When the affected layer remains on the surface after the processing, the affected layer is removed. As such method, there are given, for example, a method including removing the affected layer through use of reactive ion etching (RIE) or a chemical liquid, and a method including annealing the substrate.

The Group-III element nitride semiconductor substrate according to the embodiment of the present invention may be produced by any appropriate method to the extent that the effects of the present invention are not impaired. In terms of expressing the effects of the present invention to a larger extent, a preferred method of producing the Group-III element nitride semiconductor substrate according to the embodiment of the present invention is described below.

Figure 2A:
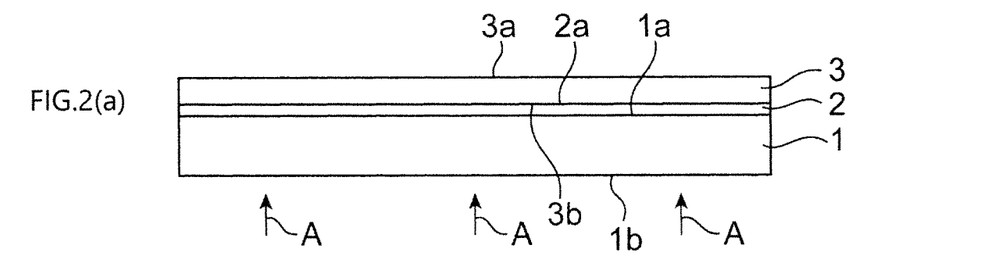
FIGS. 2(a), 2(b) and 2(c) are schematic explanatory views for illustrating a method of producing the Group-III element nitride semiconductor substrate according to the embodiment of the present invention.
Figure 2B:
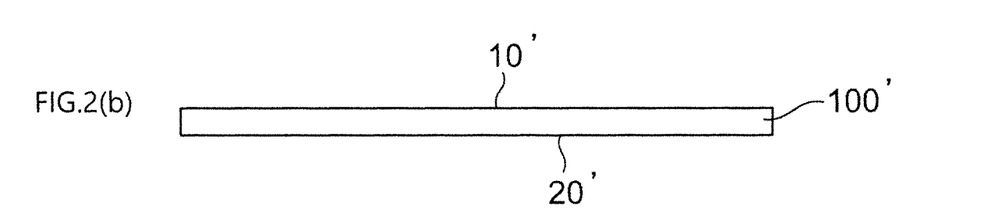

In the Group-III element nitride semiconductor substrate according to the embodiment of the present invention, typically, as illustrated in FIG. 2(a), a seed crystal film 2 is formed on a main surface 1a of a base substrate 1, and a Group-III element nitride layer 3 is formed on a Group-III element polar surface 2a of the seed crystal film 2. Next, a Group-III element nitride layer (seed crystal film 2+Group-III element nitride layer 3) serving as a freestanding substrate is separated from the base substrate 1 to provide a freestanding substrate 100' having a main surface 10' and a back surface 20' as illustrated in FIG. 2(b).

Any appropriate material may be adopted as a material for the base substrate to the extent that the effects of the present invention are not impaired. Examples of such material include sapphire, crystal oriented alumina, gallium oxide, $Al_xGa_{1-x}N$ (0≤x≤1), GaAs, and SiC.

Any appropriate material may be adopted as a material for the seed crystal film to the extent that the effects of the present invention are not impaired. Examples of such material include $Al_xGa_{1-x}N$ (0≤x≤1) and $In_xGa_{1-x}N$ (0≤x≤1). Of those, gallium nitride is preferred. The material for the seed crystal film is more preferably gallium nitride that is recognized to show a yellow luminescence effect when observed with a fluorescence microscope. The term "yellow luminescence" refers to a peak (yellow luminescence (YL) or a yellow band (YB)) appearing in the range of from 2.2 eV to 2.5 eV in addition to an exciton transition (UV) from a band to another band.

Any appropriate formation method may be adopted as a method of forming the seed crystal film to the extent that the effects of the present invention are not impaired. Such formation method is, for example, a vapor growth method, and preferred examples thereof include a metal-organic chemical vapor deposition (MOCVD) method, a hydride vapor phase epitaxy (HVPE) method, a pulsed excitation deposition (PXD) method, a molecular beam epitaxy (MBE) method, and a sublimation method. Of those, a metal-organic chemical vapor deposition (MOCVD) method is more preferred as the method of forming the seed crystal film.

The formation of the seed crystal film by the MOCVD method is preferably performed by, for example, depositing a low-temperature grown buffer layer by from 20 nm to 50 nm at from 450° C. to 550° C., and then laminating a film having a thickness of from 2 µm to 4 µm at from 1,000° C. to 1,200° C.

Any appropriate growth direction may be adopted as the growth direction of a Group-III element nitride crystal layer to the extent that the effects of the present invention are not impaired. Examples of such growth direction include: the normal direction of the c-plane of a wurtzite structure; the normal direction of each of the a-plane and m-plane thereof; and the normal direction of a plane tilted from each of the c-plane, the a-plane, and the m-plane.

Any appropriate formation method having a crystal direction substantially following the crystal direction of the seed crystal film may be adopted as a method of forming the Group-III element nitride crystal layer to the extent that the effects of the present invention are not impaired. Examples of such formation method include: gas phase growth methods, such as a metal-organic chemical vapor deposition (MOCVD) method, a hydride vapor phase epitaxy (HVPE) method, a pulsed excitation deposition (PXD) method, a molecular beam epitaxy (MBE) method, and a sublimation method; liquid phase growth methods, such as a Na flux method, an ammonothermal method, a hydrothermal method, and a sol-gel method; a powder growth method utilizing solid phase growth of powder; and a combination thereof.

When the Na flux method is adopted as the method of forming the Group-III element nitride crystal layer, the Na flux method is preferably performed in conformity with a production method described in JP 5244628 B2 by appropriately adjusting the conditions and the like so that the effects of the present invention can be expressed to a larger extent.

Next, the freestanding substrate including the Group-III element nitride crystal layer may be obtained by separating the Group-III element nitride crystal layer from the base substrate.

Any appropriate method may be adopted as a method of separating the Group-III element nitride crystal layer from the base substrate to the extent that the effects of the present invention are not impaired. Examples of such method include: a method including spontaneously separating the Group-III element nitride crystal layer from the base substrate through use of a thermal shrinkage difference in a temperature decrease step after the growth of the Group-III element nitride crystal layer; a method including separating the Group-III element nitride crystal layer from the base substrate through chemical etching; a method including separating the Group-III element nitride crystal layer from the base substrate by a laser lift-off method including applying laser light from a back surface 1b side of the base substrate 1 as indicated by the arrows A, as illustrated in FIG. 2(a); and a method of separating the Group-III element nitride crystal layer from the base substrate through grinding. In addition, the freestanding substrate including the Group-III element nitride crystal layer may be obtained by slicing the Group-III element nitride crystal layer through utilization of a wire saw or the like.

Next, the freestanding substrate is shaped into a circular shape having a desired diameter by grinding its outer peripheral portion.

Next, the main surface and/or the back surface is subjected to removal processing by surface processing, such as grinding, lapping, or polishing, to thereby provide a freestanding substrate turned into a thin plate having a desired thickness and flattened.

At the time of performing the surface processing such as grinding, lapping, or polishing, the freestanding substrate is generally bonded to a surface plate for processing, for example, through use of a wax. At this time, when a bonding pressure of the freestanding substrate to the surface plate for processing, specifically, a pressure applied to the freestanding substrate at the time of bonding the freestanding substrate to the surface plate for processing is appropriately adjusted, the Group-III element nitride semiconductor substrate according to the embodiment of the present invention may preferably satisfy at least one selected from the group consisting of the following items (1) to (3).

(1) The main surface has a maximum height Wz of a surface waviness profile of 150 nm or less.
(2) The main surface has a root mean square height Wq of the surface waviness profile of 25 nm or less.
(3) The main surface has an average length WSm of surface waviness profile elements of 0.5 mm or more.

In the case of a freestanding substrate mainly including a material having a low hardness, such as silicon, even when the surface of the freestanding substrate warps, by applying, to the entirety of the freestanding substrate, such a pressure that the surface is flattened, the freestanding substrate is easily bonded to the surface plate for processing under the state in which the entirety of the surface of the freestanding substrate smoothly changes so as to follow the flatness of the surface of the surface plate for processing, and the surface of the freestanding substrate is uniformly flattened.

Meanwhile, in the case of a freestanding substrate mainly including a material having a high hardness, such as a Group-III element nitride, when the surface of the freestanding substrate warps, the entirety of the surface does not uniformly follow the flatness of the surface of the surface plate for processing with such a pressure that the surface is flattened. Accordingly, the freestanding substrate is bonded to the surface plate for processing under the state in which the surface of the freestanding substrate has therein waviness in a local view of millimeter unit. Moreover, when the freestanding substrate is subjected to the surface processing under that state, and is removed from the surface plate for processing after the surface processing, waviness occurs in the surface of the freestanding substrate.

When the bonding pressure of the freestanding substrate to the surface plate for processing is set to be equal to or higher than a pressure at which the warped surface of the freestanding substrate is flattened, even a substrate surface having a locally warped shape can be bonded in a flattened manner. Further, at the time of bonding the freestanding substrate to the surface plate for processing, when the freestanding substrate is pressed through a soft material such as a silicone sheet placed thereon, a more uniform pressure is applied to the entirety of the freestanding substrate, and a surface having a locally curved shape can be bonded in a flattened manner. When the freestanding substrate is subjected to the surface processing under that state, and is removed from the surface plate for processing, a freestanding substrate having small surface waviness can be produced. A preferred bonding pressure of the freestanding substrate to the surface plate for processing is twice or more as high as the pressure at which the warped surface of the freestanding substrate is flattened.

A value calculated by the below-indicated equation may be used as a specific value for the pressure at which the warped surface of the freestanding substrate is flattened. While the value for the pressure may be typically calculated based on the below-indicated equation, the pressure may be further increased as required when the warped surface of the freestanding substrate is not sufficiently flattened with the value for the pressure calculated based on the below-indicated equation because of, for example, the presence of a region in which the freestanding substrate has a non-uniform thickness or non-uniform crystal quality.

$$S = 2.1 \times 10^{-11} \times B \times T^3$$

where S represents a pressure (unit: MPa), B represents the warping of the freestanding substrate (unit: μm), and T represents the thickness of the freestanding substrate (unit: μm).

However, when an excessively high pressure is applied to the freestanding substrate at the time of bonding the freestanding substrate to the surface plate for processing, there is a risk in that the freestanding substrate may be broken, cracks may occur in the freestanding substrate, or a wax amount required for bonding of the freestanding substrate to the surface plate for processing may not remain between the freestanding substrate and the surface plate for processing, and hence it is important to bond the freestanding substrate to the surface plate for processing with a pressure capable of bonding the freestanding substrate to the surface plate for processing without causing breakage or cracks in the freestanding substrate. A preferred bonding pressure of the freestanding substrate to the surface plate for processing is 10 MPa or less.

Accordingly, as described above, the "preferred bonding pressure of the freestanding substrate to the surface plate for processing" is twice or more as high as the pressure at which the warped surface of the freestanding substrate is flattened, and hence the "preferred bonding pressure of the freestanding substrate to the surface plate for processing" is (2×S) or more, more preferably (3×S) or more.

The thickness of the freestanding substrate (when the thickness is not constant, the thickness of a site having the largest thickness) is preferably from 300 μm to 1,000 μm.

The outer peripheral edge of the freestanding substrate is chamfered through grinding as required. When the affected layer remains on the main surface, the affected layer is substantially removed. In addition, when a residual stress resulting from the affected layer remains on the back surface, the residual stress is removed. Finally, the Group-III element nitride semiconductor substrate 100 according to the embodiment of the present invention is obtained.

Figure 2C:
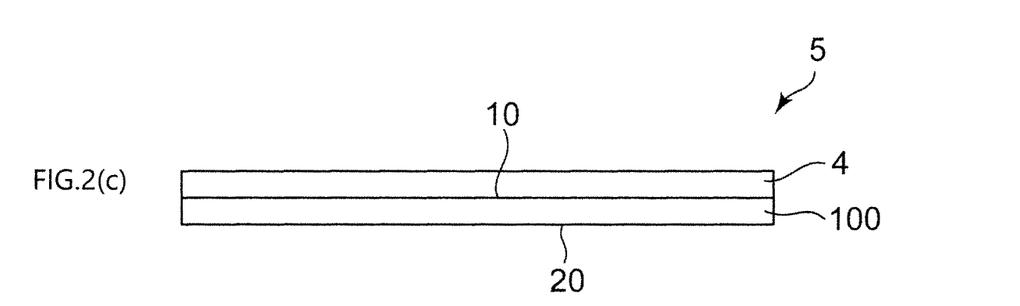

A crystal can be epitaxially grown on the main surface (Group-III element polar surface) 10 of the Group-III element nitride semiconductor substrate 100 to be obtained, and the formation of a functional layer 4 as illustrated in FIG. 2(c) provides a functional element 5. Reference numeral 20 represents the back surface (nitrogen polar surface) of the substrate.

The epitaxial crystal to be grown on the Group-III element nitride semiconductor substrate to be obtained may be, for example, gallium nitride, aluminum nitride, indium nitride, or a mixed crystal thereof. Specific examples of such epitaxial crystal include GaN, AlN, InN, $Ga_xAl_{1-x}N$ (1>x>0), $Ga_xIn_{1-x}N$ (1>x>0), $Al_xIn_{1-x}N$ (1>x>0), and $Ga_xAl_yIn_zN$ (1>x>0, 1>y>0, x+y+z=1). In addition, examples of the functional layer to be arranged on the Group-III element nitride semiconductor substrate to be obtained include a rectifying element layer, a switching element layer, and a power semiconductor layer in addition to a light-emitting layer. In addition, the thickness and total thickness variation of the freestanding substrate may be reduced by subjecting the nitrogen polar surface to processing, such as grinding or polishing, after the arrangement of the functional layer on the Group-III element polar surface of the Group-III element nitride semiconductor substrate to be obtained.

EXAMPLES

The present invention is specifically described below by way of Examples. However, the present invention is by no means limited to Examples. Test and evaluation methods in Examples and the like are as described below. The term "part(s)" in the following description means "part(s) by weight" unless otherwise specified, and the term "%" in the following description means "wt %" unless otherwise specified.

<Measurement of Surface Waviness>

A surface waviness profile of a main surface was measured based on ISO 4287:1997. A measurement length, a cut-off wavelength for removing a long-wavelength component, and a cut-off wavelength for removing a short-wavelength component were set to 8 mm, 8 mm, and 0.25 mm, respectively. When the radius of a substrate was defined as R (mm), measurement positions were set to the following 9 points of coordinate positions on the surface of the substrate: (0, 0); (0, R−5); (R−5, 0); (0, −R+5); (−R+5, 0); (0, (R−5)/2); ((R−5)/2, 0); (0, (−R+5)/2); and ((−R+5)/2, 0). The maximum height of the surface waviness profile, the root mean square height of the surface waviness profile, and the average length of surface waviness profile elements at each point were determined from the surface waviness profile obtained at each point, and the maximum values of the 9 points were used as the maximum height Wz (nm) of the surface waviness profile of the main surface, the root mean square height Wq (nm) of the surface waviness profile of the main surface, and the average length WSm (mm) of the surface waviness profile elements of the main surface of the substrate.

<Measurement of Root Mean Square Roughness Rms of Main Surface>

The root mean square roughness Rms of the main surface was measured with an atomic force microscope (AFM). A measurement range was set to a 10 μm square.

<Evaluation of Device Characteristics>

A HEMT (high electron mobility transistor) structure was epitaxially grown on a resultant freestanding substrate by a MOCVD method. The HEMT structure was obtained through sequential film formation of an i-type GaN layer of 2 μm, an AlN layer of 1 nm, and an AlGaN layer of 25 nm on the freestanding substrate. The Al composition of the AlGaN layer was set to 30%.

Ti/Al/Ni/Au (thicknesses: 15 nm/7 nm/10 nm/50 nm) were deposited thereon as drain and source electrodes, and were then annealed with a RTA at 700° C. for 30 seconds. After that, Pd/Ti/Au (thicknesses: 40 nm/15 nm/80 nm) were formed thereon through deposition as a gate electrode. Patterning was performed by a photolithography process.

In the patterning, a unit gate width, a gate length, and a longitudinal length of an element size were set to 150 μm, 2 μm, and 1 mm, respectively, and a lateral length of the element size was changed within the range of from 0.5 mm to 5 mm by changing the number of gate fingers. After that, element isolation was performed to produce HEMT elements.

A device size was changed, and evaluation of device characteristics was performed on 10 elements for each element size. Variations in device characteristics among the 10 elements at the maximum drain current were compared in each device size.

The variations in device characteristics were calculated by an absolute value for [(maximum value−minimum value)/(maximum value+minimum value)]×100(%).

Example 1

A seed crystal film made of gallium nitride having a thickness of 2 μm was formed on a sapphire substrate having a diameter of 4 inches by a MOCVD method to provide a seed crystal substrate.

The resultant seed crystal substrate was arranged in an alumina crucible in a glove box under a nitrogen atmosphere.

Next, metal gallium and metal sodium were loaded into the crucible so that the following ratio was obtained: Ga/(Ga+Na) (mol %)=15 mol %. The crucible was loaded into a container made of a heat resistant metal, and the container was then placed on a table on which a crystal growing furnace was able to be rotated. After the temperature and pressure of the crystal growing furnace were increased to 870° C. and 4.0 MPa, respectively, while this state was retained for 100 hours, a solution was stirred by rotating the container, to thereby grow a crystal. After that, annealing was performed to room temperature, and the pressure was reduced to atmospheric pressure. After that, the growing container was removed from the crystal growing furnace.

Solidified metal sodium in the crucible was removed by being washed with an alcohol. Thus, a gallium nitride crystal layer (thickness: 1 mm) without cracks was obtained on the seed crystal substrate.

The base substrate was separated from the gallium nitride crystal layer by a laser lift-off (LLO) method, to thereby provide a gallium nitride freestanding substrate.

The gallium nitride freestanding substrate was shaped into a circular shape having a diameter of 100 mm by grinding the outer peripheral portion of the gallium nitride freestanding substrate.

The resultant freestanding substrate was bonded to a ceramic-made surface plate for processing with a wax, and the Ga polar surface thereof was ground and lapped. The resultant surface was subjected to surface processing serving as final finish with diamond abrasive grains each having a grain diameter of 0.1 μm until a root mean square roughness Rms became 1 nm or less, and then an affected layer was removed through RIE. At the time of bonding the freestanding substrate to the surface plate for processing, a load was applied while a silicone sheet having a thickness of 2 mm was placed on the freestanding substrate so as to cover the entirety of the surface of the freestanding substrate. A pressure to be applied to the entirety of the surface of the freestanding substrate was set to 1.5 MPa.

After the surface processing, the maximum height Wz of a surface waviness profile, the root mean square height Wq of the surface waviness profile, and the average length WSm of surface waviness profile elements were measured on the following 9 points of coordinate positions: (0, 0); (0, 45); (45, 0); (0, −45); (−45, 0); (0, 22.5); (22.5, 0); (0, −22.5); and (−22.5, 0) when an a-axis of a gallium nitride single crystal passing through the center of the substrate was defined as an X-axis, and an m-axis passing through the center of the substrate and perpendicular to the X-axis was defined as a Y-axis. The maximum values for Wz, Wq, and WSm of the 9 points were 31 nm, 8 nm, and 4.2 mm, respectively.

Next, the freestanding substrate in which the Ga polar surface had been processed was reversed and fixed to the ceramic-made surface plate for processing with a wax, and the nitrogen polar surface thereof was ground and lapped. The resultant surface was subjected to mirror finish serving as final finish with diamond abrasive grains each having a grain diameter of 0.1 μm, and then an affected layer was removed through RIE.

Thus, a wafer (1) serving as a gallium nitride freestanding substrate was produced.

The wafer (1) had a thickness of 500 μm.

The results were shown in Table 1.

Example 2

A wafer (2) serving as a gallium nitride freestanding substrate was produced in the same manner as in Example 1 except that the pressure to be applied to the freestanding substrate at the time of bonding the freestanding substrate to the surface plate for processing was changed to 1.2 MPa.

The wafer (2) had a thickness of 500 μm.

The respective maximum values for the maximum height Wz of the surface waviness profile, for the root mean square height Wq of the surface waviness profile, and for the average length WSm of the surface waviness profile elements were 59 nm for Wz, 10 nm for Wq, and 2.9 mm for WSm.

The results were shown in Table 1.

Example 3

A wafer (3) serving as a gallium nitride freestanding substrate was produced in the same manner as in Example 1 except that the pressure to be applied to the freestanding substrate at the time of bonding the freestanding substrate to the surface plate for processing was changed to 0.9 MPa.

The wafer (3) had a thickness of 500 μm.

The respective maximum values for the maximum height Wz of the surface waviness profile, for the root mean square height Wq of the surface waviness profile, and for the average length WSm of the surface waviness profile elements were 113 nm for Wz, 17 nm for Wq, and 1.6 mm for WSm.

The results were shown in Table 1.

Example 4

A wafer (4) serving as a gallium nitride freestanding substrate was produced in the same manner as in Example 1 except that the pressure to be applied to the freestanding substrate at the time of bonding the freestanding substrate to the surface plate for processing was changed to 0.6 MPa.

The wafer (4) had a thickness of 500 μm.

The respective maximum values for the maximum height Wz of the surface waviness profile, for the root mean square height Wq of the surface waviness profile, and for the average length WSm of the surface waviness profile elements were 147 nm for Wz, 23 nm for Wq, and 1.1 mm for WSm.

The results were shown in Table 1.

Comparative Example 1

A wafer (C1) serving as a gallium nitride freestanding substrate was produced in the same manner as in Example 1 except that the pressure to be applied to the freestanding substrate at the time of bonding the freestanding substrate to the surface plate for processing was changed to 0.3 MPa.

The wafer (C1) had a thickness of 500 μm.

The respective maximum values for the maximum height Wz of the surface waviness profile, for the root mean square height Wq of the surface waviness profile, and for the average length WSm of the surface waviness profile elements were 202 nm for Wz, 36 nm for Wq, and 0.4 mm for WSm.

The results were shown in Table 1.

TABLE 1

| | Various values based on surface waviness profile | | | | Evaluation of device characteristics (variations in device characteristics) | | |
|---|---|---|---|---|---|---|---|
| | | | | | Lateral length of element size = 1 mm | Lateral length of element size = 2.5 mm | Lateral length of element size = 5 mm |
| | Wz (nm) | Wq (nm) | WSm (mm) | Rms (nm) | | | |
| Example 1 | 31 | 8 | 4.2 | 0.2 | 4 | 6 | 8 |
| Example 2 | 59 | 10 | 2.9 | 0.2 | 5 | 6 | 9 |
| Example 3 | 113 | 17 | 1.6 | 0.2 | 6 | 7 | 9 |
| Example 4 | 147 | 23 | 1.1 | 0.2 | 6 | 9 | 11 |
| Comparative Example 1 | 202 | 36 | 0.4 | 0.2 | 26 | 31 | 38 |

In each of Examples 1 to 4 and Comparative Example 1, the root mean square roughness Rms had such a sufficiently small value as to enable satisfactory epitaxial growth irrespective of the magnitude of surface waviness. A possible reason for independence from the magnitude of the surface waviness is that a local surface roughness is measured.

In each of Examples 1 to 4, even when the element size of the device was increased, variations in device characteristics were sufficiently suppressed. Meanwhile, as seen in Comparative Example 1, when the surface waviness of the substrate was increased, variations in device characteristics were increased. Further, as the element size of the device was increased more, the variations in device characteristics were increased more.

The Group-III element nitride semiconductor substrate according to the embodiment of the present invention may be utilized as each of the substrates of various semiconductor devices.

According to the present invention, the Group-III element nitride semiconductor substrate including the first surface and the second surface, in which even when devices to be produced on the first surface are increased in size, variations in device characteristics between the devices in the same substrate are suppressed, can be provided.

Many other modifications will be apparent to and be readily practiced by those skilled in the art without departing from the scope and spirit of the invention. It should therefore be understood that the scope of the appended claims is not intended to be limited by the details of the description but should rather be broadly construed.

What is claimed is:

1. A Group-III element nitride semiconductor substrate, comprising:
   a first surface; and
   a second surface,
   wherein the first surface has a maximum height Wz of a surface waviness profile of 150 nm or less.

2. A Group-III element nitride semiconductor substrate, comprising:
   a first surface; and
   a second surface,
   wherein the first surface has a root mean square height Wq of a surface waviness profile of 25 nm or less.

3. A Group-III element nitride semiconductor substrate, comprising:
   a first surface; and
   a second surface,
   wherein the first surface has an average length WSm of surface waviness profile elements of 0.5 nm or more.

4. The Group-III element nitride semiconductor substrate according to claim 1, wherein the first surface of the Group-III element nitride semiconductor substrate has a root mean square roughness Rms of 10 nm or less.

5. The Group-III element nitride semiconductor substrate according to claim 1, wherein the Group-III element nitride semiconductor substrate has a diameter of 75 mm or more.

6. The Group-III element nitride semiconductor substrate according to claim 2, wherein the first surface of the Group-III element nitride semiconductor substrate has a root mean square roughness Rms of 10 nm or less.

7. The Group-III element nitride semiconductor substrate according to claim 3, wherein the first surface of the Group-III element nitride semiconductor substrate has a root mean square roughness Rms of 10 nm or less.

8. The Group-III element nitride semiconductor substrate according to claim 2, wherein the Group-III element nitride semiconductor substrate has a diameter of 75 mm or more.

9. The Group-III element nitride semiconductor substrate according to claim 3, wherein the Group-III element nitride semiconductor substrate has a diameter of 75 mm or more.

10. A Group-III element nitride semiconductor substrate, comprising:
   a first surface; and
   a second surface,
   wherein the first surface has a maximum height Wz of a surface waviness profile of 150 nm or less, a root mean square height Wq of a surface waviness profile of 25 nm or less, and an average length WSm of surface waviness profile elements of 0.5 nm or more.

11. The Group-III element nitride semiconductor substrate according to claim 10, wherein the first surface of the Group-III element nitride semiconductor substrate has a root mean square roughness Rms of 10 nm or less.

12. The Group-III element nitride semiconductor substrate according to claim 11, wherein the Group-III element nitride semiconductor substrate has a diameter of 75 mm or more.

* * * * *